United States Patent
Shirai

[11] Patent Number: 5,963,365
[45] Date of Patent: Oct. 5, 1999

[54] THREE LAYER ANTI-REFLECTIVE COATING FOR OPTICAL SUBSTRATE

[75] Inventor: Takeshi Shirai, Kanagawa, Japan

[73] Assignee: Nikon Corporation, Tokyo, Japan

[21] Appl. No.: 08/871,612

[22] Filed: Jun. 10, 1997

[30] Foreign Application Priority Data

Jun. 10, 1996 [JP] Japan .................................... 8-147019

[51] Int. Cl.$^6$ ................................ G02B 5/28; G02B 1/11
[52] U.S. Cl. .......................................... 359/359; 359/589
[58] Field of Search .................................. 359/581, 586, 359/588, 589, 360

[56] References Cited

U.S. PATENT DOCUMENTS

| | | | |
|---|---|---|---|
| 3,761,160 | 9/1973 | Apfel et al. | 359/588 |
| 3,781,990 | 1/1974 | Sumita | 359/588 |
| 3,854,796 | 12/1974 | Thelen | 359/588 |
| 3,858,965 | 1/1975 | Sumtia | 359/588 |
| 4,313,647 | 2/1982 | Takazawa | 359/588 |
| 4,387,690 | 6/1983 | Tani | 359/588 |
| 4,784,467 | 11/1988 | Akatsuka et al. | 359/588 |
| 5,661,596 | 8/1997 | Biro et al. | 359/588 |
| 5,725,959 | 3/1998 | Terada et al. | 359/588 |

FOREIGN PATENT DOCUMENTS 61-77002  4/1986  Japan .

*Primary Examiner*—Jon Henry
*Attorney, Agent, or Firm*—Klarquist Sparkman Campbell Leigh & Whinston, LLP

[57] ABSTRACT

Anti-reflective coatings for use on an optical substrate are disclosed having a low reflectance over a broad band of wavelengths in the ultraviolet range and exhibiting excellent "laser durability." The anti-reflective coatings comprise a layer of high-refractive index material situated between at least two layers of low-refractive index material. The layers of high- and low-refractive index material are laminated onto an optical substrate, such as glass or quartz. The anti-reflective coating minimizes the loss of light due to flares, ghosts, etc. Additionally, reflections are reduced over a broad range of incidence angles.

16 Claims, 6 Drawing Sheets

THREE LAYER ANTI-REFLECTIVE COATING FOR OPTICAL SUBSTRATE

FIELD OF THE INVENTION

This invention pertains to an anti-reflective coating that exhibits low reflectance when exposed to excimer laser or other high-intensity ultraviolet (UV) light.

BACKGROUND OF THE INVENTION

The manufacture of integrated circuits generally involves using compact projection aligners, such as steppers, that focus a high-intensity light beam through optical elements (e.g., lenses) to transfer a circuit pattern onto a semiconductor wafer.

There has been a growing demand for compact projection aligners with increased resolution. One method for increasing resolution is by shortening the wavelength of a light source used in the compact projection aligner. For example, a stepper may include a high-output excimer laser that uses a mercury lamp as the light source for generating light in the short-wavelength range. Examples of excimer lasers that generate a short wavelength light beam include KrF excimer lasers ($\lambda$=248.4 nm) and ArF excimer lasers ($\lambda$=193.4 nm).

An anti-reflective coating is formed on the optical elements in the stepper in order to decrease light loss, flare, and ghosts, etc., that result from surface reflections. Anti-reflective coatings, however, may also cause loss of light due to absorption. The degree of absorption may be particularly high when a coating is exposed to short-wavelength light, such as excimer laser light. Additionally, heat generated by absorption can break down the anti-reflective coating and deform the substrate surface. For the aforementioned lasers, the coating materials having the lowest absorbency and the highest degree of laser resistance (i.e., durability to exposure of high-intensity UV light, especially UV laser light, such as excimer laser light) are limited to fluoride compounds, such as magnesium fluoride ($MgF_2$), and some oxides. The optical substrates with which such coatings are used are limited to fluorite crystals, silica, and quartz.

A known anti-reflective coating is shown in FIG. 8. The coating has a 2-layer composition including a first layer 13 with a high refractive index and a second layer 14 with a low refractive index laminated onto an optical substrate 11. The desired anti-reflection conditions of the coating are defined by the following equation:

$$n_s/n_o \leq (n_2/n_1)^2 \qquad (1)$$

The term $n_s$ denotes the refractive index of the optical substrate; the term $n_o$ denotes the refractive index of the medium through which the light travels (i.e., typically air having a refractive index of 1); the term $n_1$ denotes the refractive index of the second layer 14 (i.e., the low refractive index layer), and the term $n_2$ denotes the refractive index of the first layer 13 (i.e., the high refractive index layer).

When applied to a known coating using a high intensity light source with a design center wavelength of $\lambda_0$=193.4 nm, equation (1) is not satisfied. For example, if the optical substrate 11 is made of quartz glass (n=1.56), the high-refractive index layer 13 is lanthanum(III) fluoride ($LaF_3$, n=1.69), and the low-refractive index layer 14 is magnesium fluoride ($MgF_2$, n=1.42), the result is as follows:

$$1.56/1 > (1.69/1.42)^2 \approx 1.42 \qquad (2)$$

Notably, the equation is not satisfied because the left-hand side of the equation is greater than (rather than less than) the right-hand side. Thus, this embodiment is insufficient to meet the anti-reflection conditions.

For the FIG. 8 embodiment, the optical substrate and coating materials used and the associated thicknesses of each are as follows:

| | |
|---|---|
| Substrate: | quartz glass |
| First layer: | $LaF_3$ (0.25)$\lambda_0$ |
| Second layer: | $MgF_2$ (0.25)$\lambda_0$ |
| Medium: | Air |

FIGS. 9, 10, and 11 show the characteristics of a 2-layer conventional anti-reflective coating. FIG. 9 shows the reflectance as a function of wavelength with an angle of incidence $\theta$=0. At $\lambda$=193.4 nm, the 2-layer anti-reflective coating has a residual reflection of about 0.2%. When used in an optical system having 50 lenses, light passes through one hundred anti-reflective coating surfaces. Due to the resulting residual reflection, close to 20% ($1-(1-0.002)^{100}$=0.18) of the light does not pass through the optical system. This translates into a substantial decline in exposure efficiency. Furthermore, the significant reflection also can cause flare and ghost, etc., which reduces the exposure precision.

FIG. 10 shows the reflectance as a function of angle. The reflectance is at about 0.2% with $\theta$=0° and is greater than 0.5% at approximately $\theta$=32°.

FIG. 11 shows the optical admittance when $\lambda$=193.4 nm. Preferably, the end point of the admittance locus should come close to the point (1,0) expressing the refractive index of the medium, air. FIG. 11, however, shows the optical admittance is skewed to the right, which further illustrates the deficiency of the 2-layer coating.

In order to meet anti-reflection requirements, an optical substrate having a lower refractive index with a high-refractive index material and a low-refractive index material laminated on the optical substrate may be used. However, because the types of optical substrates and coating materials used in the 2-layered approach is limited, as described above, residual reflections still occur.

SUMMARY OF THE INVENTION

In view of the foregoing shortcomings of the prior art, an object of the invention is to provide an anti-reflective coating with substantially reduced reflectance for an optical substrate. A further object of the invention is to provide such an anti-reflective coating that has minimal loss of light due to flares, ghosts, etc. A yet further object of the present invention is to reduce the reflectance of light from an optical element, such as a lens, over a broadened range of incidence angles. A still further object of the present invention is to provide such a coating that has high laser resistance and low absorbency.

The foregoing objects are attained by anti-reflective coatings according to the present invention. According to one aspect of the invention, the coating comprises at least three layers of low- and high-refractive index material laminated on an optical substrate, such as glass. The three layers include a layer of high-refractive index material situated between two layers of low-refractive index material.

The first and second layers of low-refractive index material have a refractive index that is lower than that of the optical substrate. Additionally, the high-refractive index material has a refractive index that is higher than that of the optical substrate. The low-refractive index layers may be formed from a variety of materials such as magnesium fluoride, aluminum fluoride, sodium fluoride, lithium fluoride, calcium fluoride, barium fluoride, strontium fluoride, cryolite, and chiolite, and/or combinations thereof. The high-refractive index material may be formed from neodymium fluoride, lanthanum fluoride, gadolinium fluoride, dysprosium fluoride, aluminum oxide, lead fluoride, and yttrium fluoride, and/or combinations thereof. The anti-reflective coating is at least applicable to wavelengths within the range of 150–300 nm.

According to another aspect of the invention a third low-refractive index layer is situated between the optical substrate and the first low-refractive index layer. The third low-refractive index layer has an optical thickness that is an integer multiple of $(0.5)\lambda$.

The foregoing and additional features and advantages of the invention will be more readily apparent from the following detailed description, which proceeds with reference to the accompanying drawings.

DETAILED DESCRIPTION

Example Embodiment 1

Figure 1:
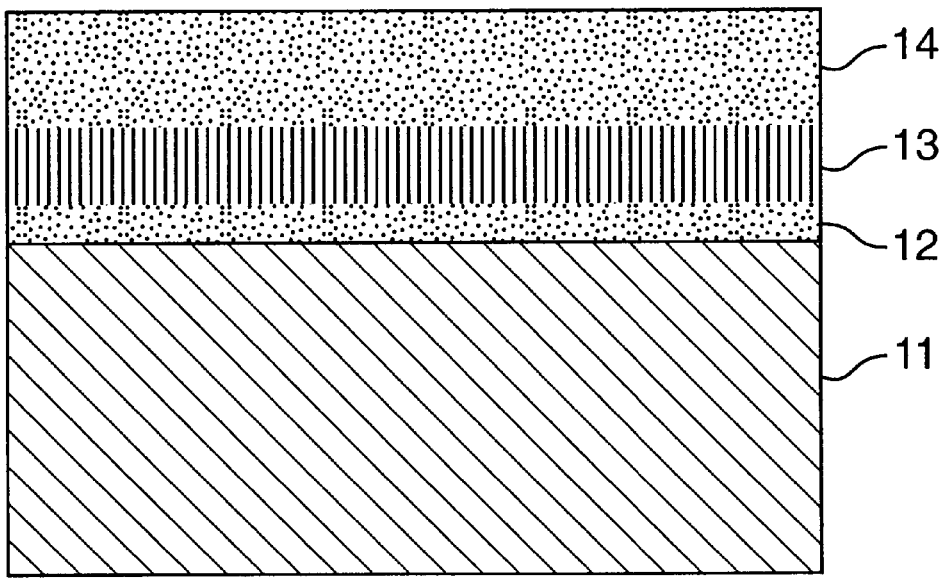
FIG. 1 is a cross-sectional view of the anti-reflective coating according to a first example embodiment of the present invention.

FIG. 1 shows a cross-sectional view of the anti-reflective coating laminated on an optical substrate 11 according to a first example embodiment of the present invention. The anti-reflective coating includes two layers 12, 14 of low-refractive index material sandwiching a layer 13 of high-refractive index material. The layer 12 is positioned closest to the optical substrate 11, while layer 13 is situated between layers 12 and 14. These layers or films are laminated on the optical substrate 11 using commonly known techniques such as vacuum deposition, sputtering, ion plating, etc. Using this embodiment, surface reflection can be dramatically reduced with a reflectance of nearly zero for any wavelength in a wavelength range of $\lambda=150$–$300$ nm, as is further described below.

A low-refractive index layer is defined as a layer made from material having a refractive index lower than that of the optical substrate 11. Examples of materials that can be used as the low-refractive index layers include magnesium fluoride ($MgF_2$), aluminum fluoride ($AlF_3$), sodium fluoride (NaF), lithium fluoride (LiF), calcium fluoride ($CaF_2$), barium fluoride ($BaF_2$), strontium fluoride ($SrF_2$), cryolite ($Na_3AlF_6$), and chiolite ($Na_5Al_3F_{14}$), as well as combinations of these materials. The desired anti-reflective effect can be obtained when either the same or different low-refractive index materials are used for layers 12 and 14. The low-refractive index layer 12 may have an optical film thickness of $(0.05)\lambda_0$ to $(0.15)\lambda_0$, wherein $\lambda_0$ is the design-center wavelength. The second low-refractive index layer may have an optical film thickness of $(0.2)\lambda_0$ to $(0.3)\lambda_0$.

A high-refractive index layer is defined as a layer made from material having a refractive index that is higher than the optical substrate 11. Examples of materials that can be used for the high-refractive index layer include neodymium fluoride ($NdF_3$), lanthanum fluoride ($LaF_3$), gadolinium fluoride ($GdF_3$), dysprosium fluoride ($DyF_3$), aluminum oxide ($Al_2O_3$), lead fluoride ($PbF_2$), and yttrium fluoride ($YF_3$), as well as combinations of these materials. The high-refractive index layer may have an optical film thickness of $(0.2)\lambda_0$ to $(0.35)\lambda_0$.

An exemplary composition of the anti-reflective coating of FIG. 1 includes the following (as applied to a quartz glass optical substrate):

| | |
|---|---|
| First layer: | $MgF_2$ $(0.10)\lambda_0$ |
| Second layer: | $LaF_3$ $(0.30)\lambda_0$ |
| Third layer: | $MgF_2$ $(0.25)\lambda_0$ |
| Air | | wherein $\lambda_0$ is the design center wavelength, and is preferably 193.4 nm, although it can be established anywhere within a range from 150–300 nm.

Figure 2:
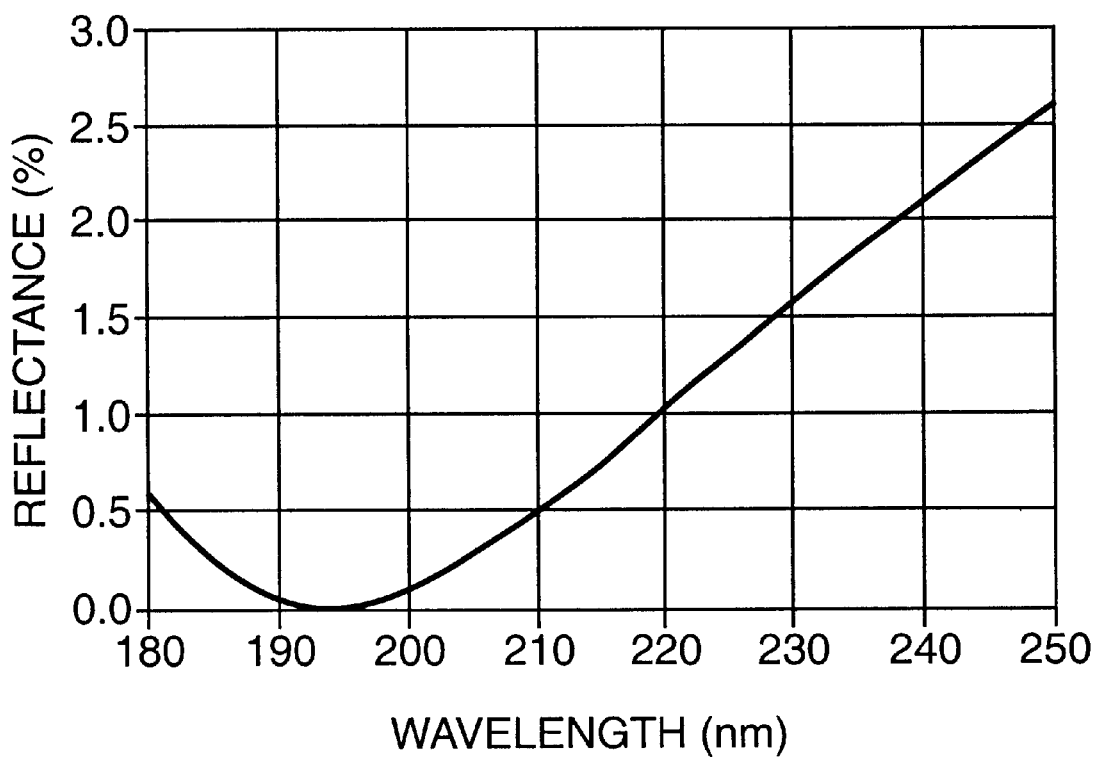
FIG. 2 is a graph of the reflectance as a function of wavelength $\lambda$ for the anti-reflective coating of FIG. 1 with an incidence angle of $\theta=0°$.
Figure 9:
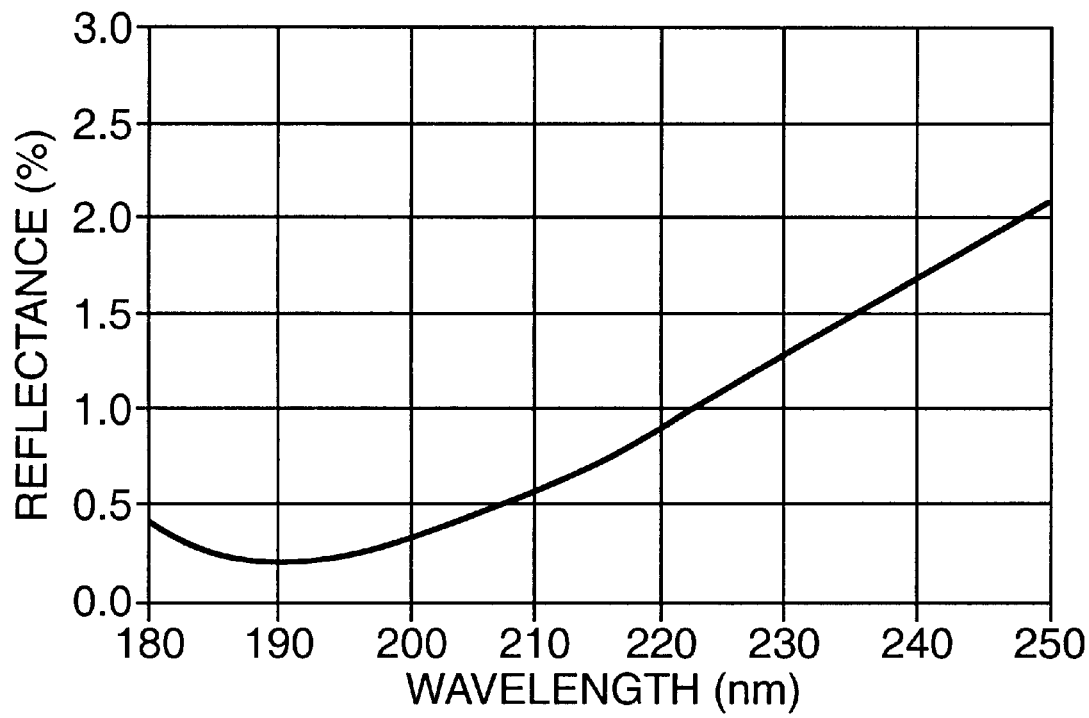
FIG. 9 is a graph of the reflectance as a function of wavelength $\lambda$ for the prior art anti-reflective coating of FIG. 8 at an incidence angle of $\theta=0°$.

FIG. 2 is a graph of reflectance as a function of wavelength for the anti-reflective coating of FIG. 1 with an incidence angle of $\theta=0°$. Notably, the reflectance is almost 0 when $\lambda=194.3$. This is a significant improvement over the prior art reflective properties shown in FIG. 9, where the reflectance is approximately 0.2% at that wavelength.

Figure 3:
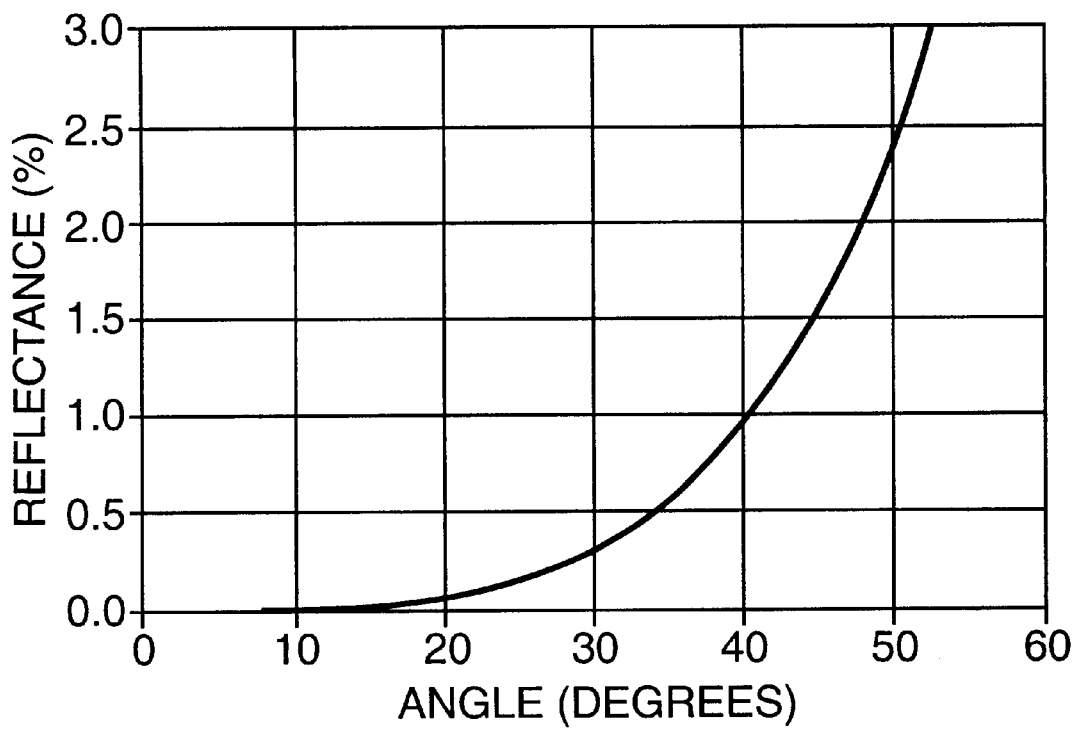
FIG. 3 is a graph of the incidence-angle characteristics of the anti-reflective coating of FIG. 1 at a wavelength $\lambda$ of 193.4 nm.
Figure 10:
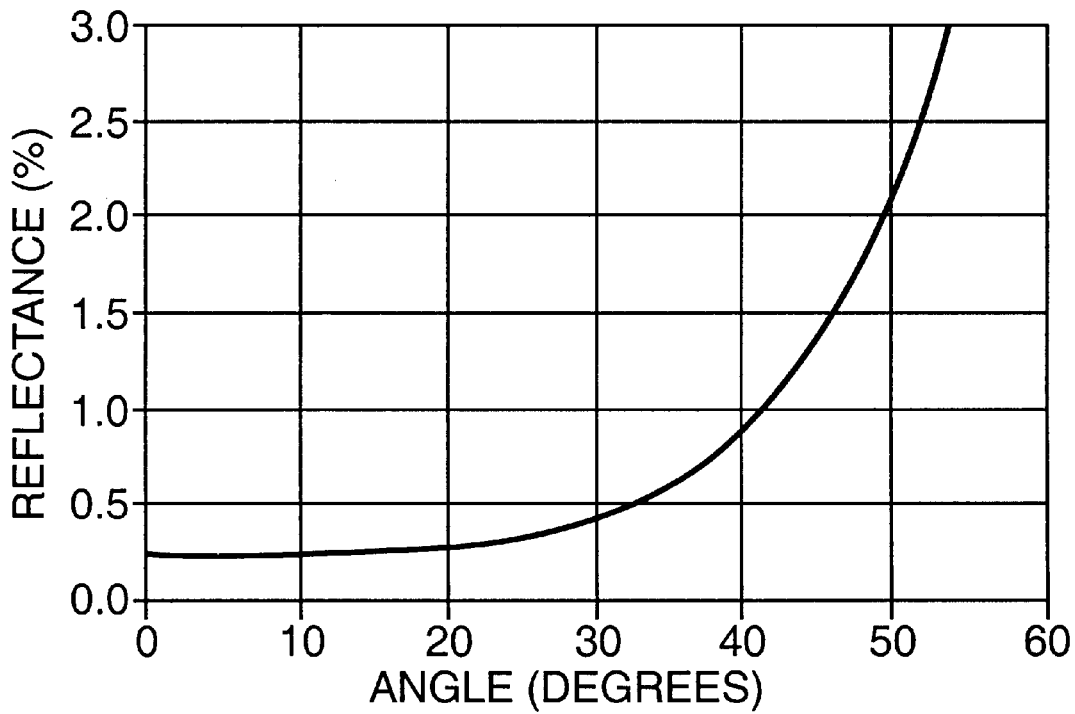
FIG. 10 is a graph of the incidence-angle characteristics of the prior art anti-reflective coating of FIG. 8 at a wavelength $\lambda$ of 193.4 nm.
Figure 11:
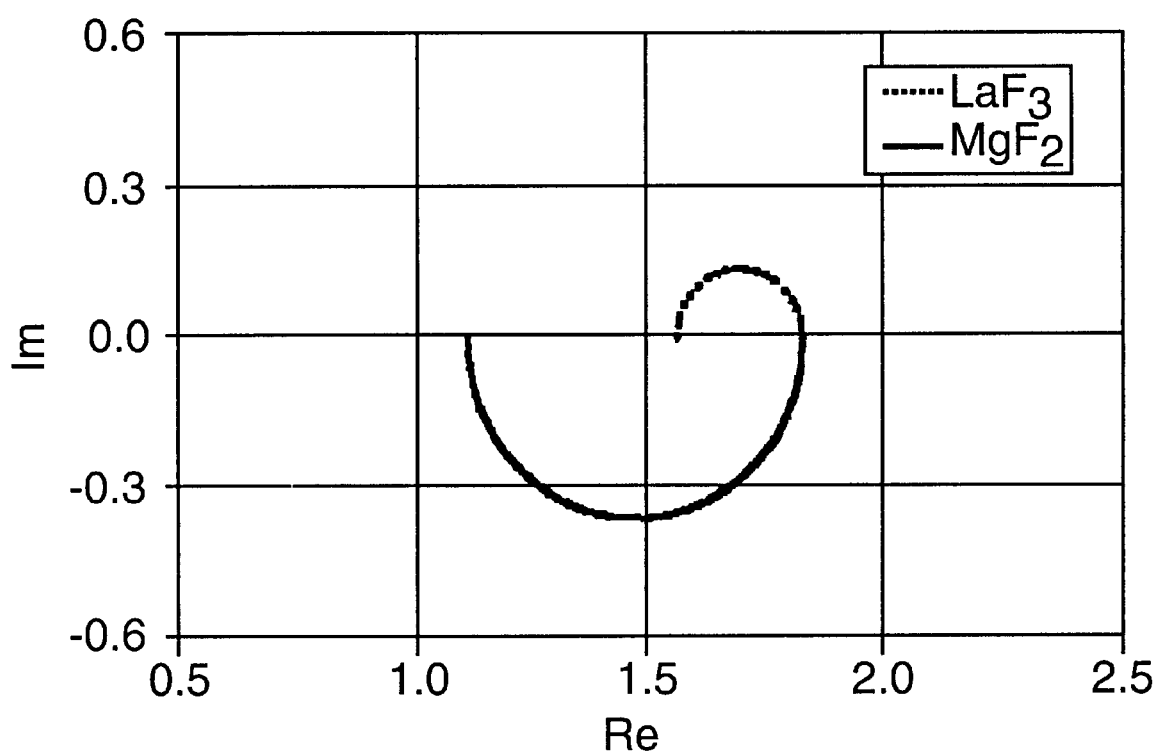
FIG. 11 is a graph of the optical admittance of the prior art anti-reflective coating of FIG. 8 at a wavelength $\lambda$ of 193.4 nm.

FIG. 3 is a graph of the incidence-angle characteristics of the anti-reflective coating of FIG. 1 at a wavelength $\lambda$ of 193.4 nm. Comparing FIG. 3 to the prior-art reflectance shown in FIG. 10, FIG. 3 shows substantially lower reflectance, particularly for angles of incidence between $\theta=0°$ and $30°$.

Figure 4:
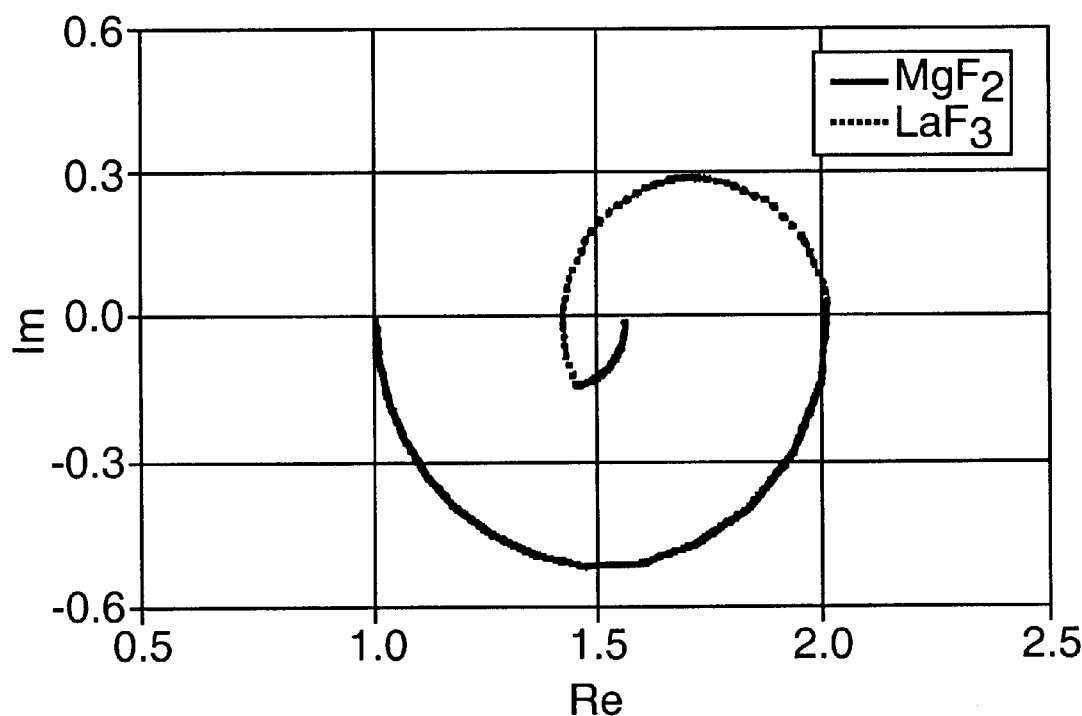
FIG. 4 is a graph of the optical admittance of the anti-reflective coating of FIG. 1 at a wavelength $\lambda$ of 193.4 nm.

FIG. 4 shows the optical admittance of the anti-reflective coating of FIG. 1 with $\lambda$ at 193.4 nm. The locus of the admittance for the high-refractive index layer 13 (shown in dashed lines) ends at about (2.01, 0). This indicates that the optical substrate 11, the low-refractive index layer 12, and the high-refractive index layer 13, together can be considered as a single substance having a refractive index of n=2.01. In other words, the anti-reflective coating of FIG. 1 acts as a single low-refractive index layer 14 situated on an optical substrate having a refractive index of n=2.01.

The desired anti-reflection conditions of the FIG. 1 coating are defined by the following equation:

$$n_s \cdot n_0 = n_1^2 \tag{3}$$

wherein $n_s$ is the refractive index of the optical substrate, $n_0$ is the refractive index of the medium (e.g., air), and $n_1$ is the refractive index of the single layer 14 with a low refractive index (MgF$_2$, n=1.42).

Substituting these values into equation (3) provides the following:

$$(2.01) \cdot 1 \approx (1.42)^2 \qquad (4)$$

Although not identical (i.e., $(1.42)^2=2.02$, not 2.01), this result is sufficient to satisfy anti-reflective requirements conditions and a good anti-reflective coating with a very low refractive index can be obtained. Consequently, when an anti-reflective coating of the present invention is used in an optical system, such as a stepper, and particularly if it is used on lenses therein, the loss of light, flare, and ghosts, etc., due to residual reflection are nearly eliminated. An excellent exposure efficiency and exposure accuracy, therefore, can be obtained.

Example Embodiment 2

Figure 5:
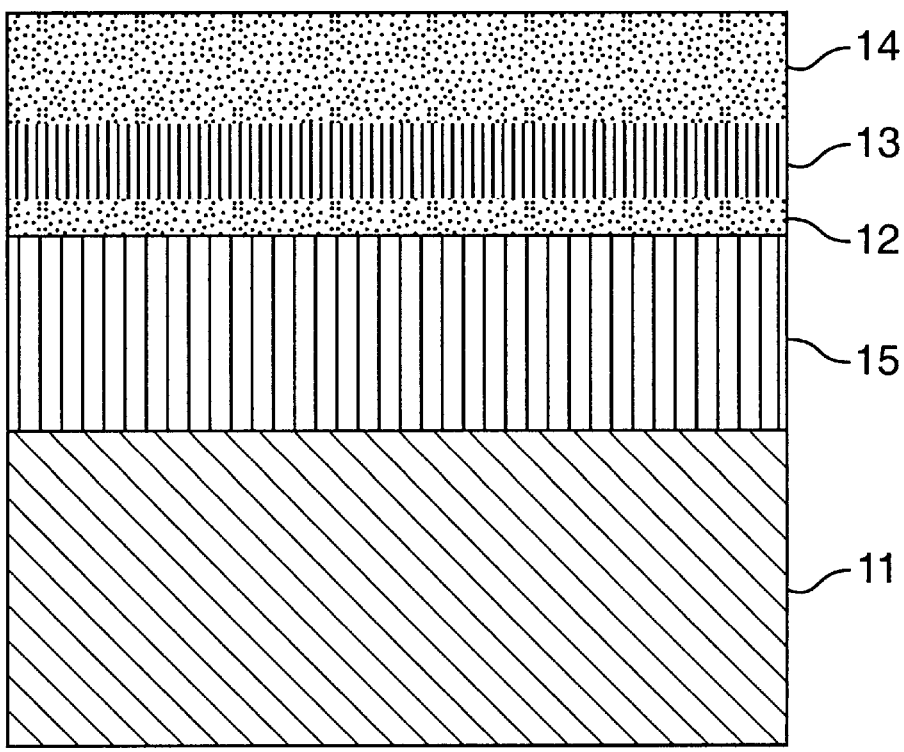
FIG. 5 is a cross-sectional view of an anti-reflective coating according to a second example embodiment of the present invention.

FIG. 5 shows a second example embodiment of the present invention. The anti-reflective coating of FIG. 5, which is similar to that of FIG. 1 as applied to an optical substrate 11, includes a first low-refractive index layer 12, a high-refractive index layer 13, and a second low-refractive index layer 14. An additional low-refractive index layer 15 is situated between the low-refractive index layer 12 and the optical substrate 11. The low refractive index layer 15 has an optical film thickness that is an integer multiple of $(0.5)\lambda_0$. The layer 15 may be formed from the same materials or different materials than those used for the low-refractive index layers 12 and 14 described in relation to FIG. 1.

An exemplary composition of the anti-reflective coating of FIG. 5 includes the following (as applied to quartz glass as an optical substrate):

| | | |
|---|---|---|
| First layer: | Na$_3$AlF$_6$ | $(1.00)\lambda_0$ |
| Second layer: | MgF$_2$ | $(0.10)\lambda_0$ |
| Third layer: | LaF$_3$ | $(0.30)\lambda_0$ |
| Fourth layer: | MgF$_2$ | $(0.25)\lambda_0$ |
| Air | | |

Figure 6:
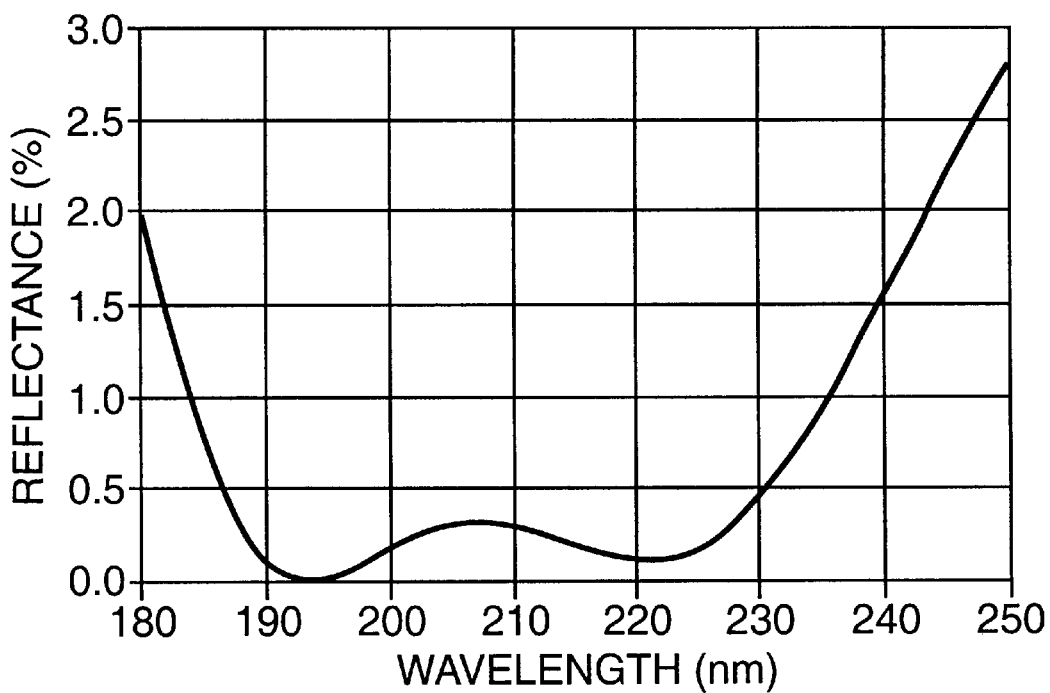
FIG. 6 is a graph of reflectance as a function of wavelength $\lambda$ for the anti-reflective coating of FIG. 5 with an incidence angle of $\theta=0°$.

FIG. 6 shows the reflection properties of the anti-reflective coating of FIG. 5 with an incidence angle of $\theta=0°$. Like the FIG. 1 embodiment, at $\lambda=194.3$ nm, the reflectance is almost 0. Moreover, the range of wavelengths exhibiting low reflection is broader using the FIG. 5 embodiment.

Figure 7:
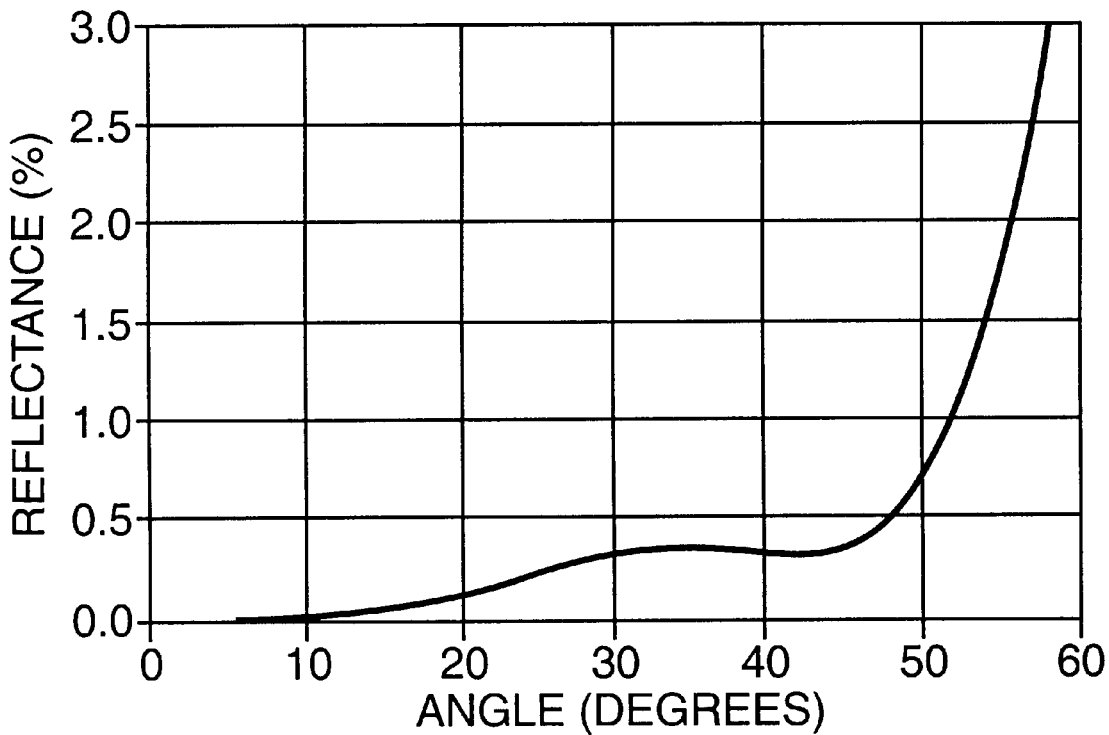
FIG. 7 is a graph of the incidence-angle characteristics of the anti-reflective coating of FIG. 5 at a wavelength $\lambda$ of 193.4 nm.
Figure 8:
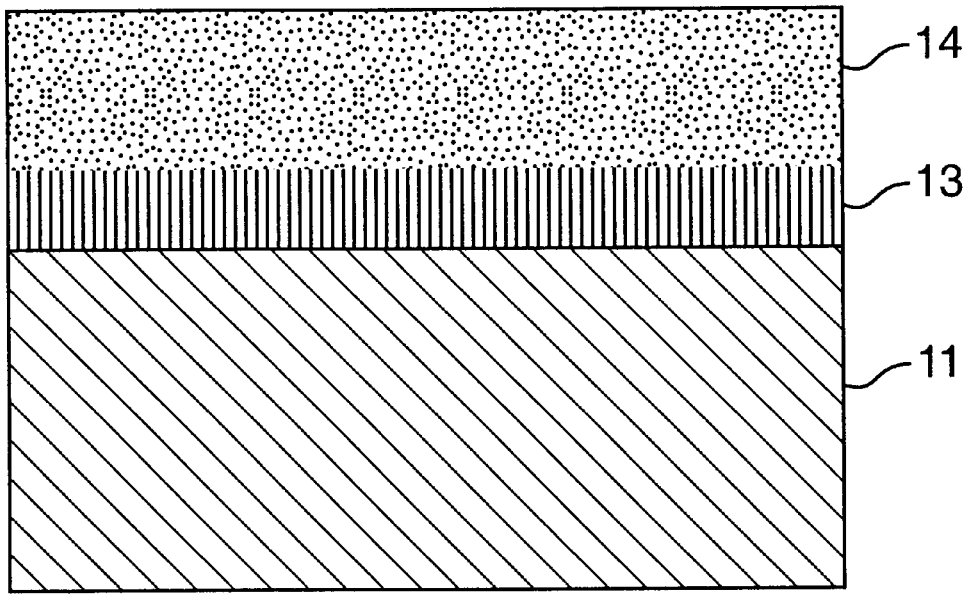
FIG. 8 is a cross-sectional view of a prior art 2-layer anti-reflective coating.

FIG. 7 shows a graph of the incidence-angle characteristics for the anti-reflective coating of FIG. 5 with a wavelength $\lambda$ of 193.4 nm. Comparison to the prior-art incidence-angle characteristics (FIG. 10) shows that the FIG. 5 embodiment exhibits a lower reflectance over a broader range of angles. Specifically, using the conventional 2-layer anti-reflective film (FIG. 8), the range of incidence angles exhibiting a reflectance of $\leq 0.5\%$ is approximately $\theta=\pm 30°$, while with the FIG. 5 embodiment, incidence-angle characteristics are improved up to angles of approximately $\theta=\pm 45°$. Consequently, even when formed on lenses, etc., with small degrees of curvature, a good anti-reflective effect can be obtained on the entire surface of the lens.

Furthermore, by establishing the integer-multiple low-refractive index layer 14 with an optical film thickness of $(0.5)\lambda_0$ as the first layer, the laser resistance properties are improved.

Whereas the invention has been described in connection with multiple example embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. An optical element, comprising:
   (a) an optical substrate;
   (b) at most three layers of low- and high-refractive index material laminated on a surface of the optical substrate, the three layers comprising a layer of high-refractive index material situated between first and second layers of low-refractive index material;
   (c) the first low-refractive index layer being adjacent the optical substrate and having an optical film thickness of $(0.05)\lambda_0$ to $(0.15)\lambda_0$;
   (d) the high-refractive index layer having an optical film thickness of $(0.2)\lambda_0$ to $(0.35)\lambda_0$; and
   (e) the second low-refractive index layer having an optical film thickness of $(0.2)\lambda_0$ to $(0.3)\lambda_0$, wherein $\lambda_0$ is a design-center wavelength for the optical element and is within a range of 150–300 nm.

2. The optical element of claim 1, wherein the first and second low-refractive index layers have a refractive index that is lower than the refractive index of the optical substrate.

3. The optical element of claim 1, wherein each of the low-refractive index layers is selected from a group consisting of magnesium fluoride, aluminum fluoride, sodium fluoride, lithium fluoride, calcium fluoride, barium fluoride, strontium fluoride, cryolite, chiolite, and combinations thereof.

4. The optical element of claim 1, wherein the first low-refractive index layer is formed from a different material than the second low-refractive index layer.

5. The optical element of claim 1, wherein the high-refractive index layer has a refractive index that is higher than that of the optical substrate.

6. The optical element of claim 1, wherein the high-refractive index layer is selected from a group consisting of neodymium fluoride, lanthanum fluoride, gadolinium fluoride, dysprosium fluoride, aluminum oxide, lead fluoride, yttrium fluoride, and combinations thereof.

7. The optical element of claim 1, wherein the optical substrate is glass.

8. An optical element, comprising:
   (a) an optical substrate;
   (b) a first layer of low-refractive index material on a surface of the optical substrate;
   (c) a layer of high-refractive index material superposed on the first layer of low-refractive index material;
   (d) a second layer of low-refractive index material superposed on the layer of high-refractive index material;
   (e) the first layer of low-refractive index material having an optical film thickness of $(0.05)\lambda_0$ to $(0.15)\lambda_0$, wherein the optical substrate has at most three layers laminated thereon; and $\lambda_0$ is a design-center wavelength and is within a range of 150–300 nm.

9. An optical system, comprising:
   (a) an excimer laser; and
   (b) an optical element as recited in claim 8, the optical element being for focusing a beam of ultraviolet light produced by the excimer laser.

10. The optical element of claim 1, wherein the design-center wavelength is a wavelength where reflection is reduced to a minimum.

11. The optical element of claim 1, wherein the design-center wavelength is not a wavelength where reflection is reduced to a minimum.

12. The optical element of claim 8, wherein the high-refractive index material has an optical film thickness of $(0.2) \lambda_0$ to $(0.35) \lambda_0$.

13. The optical element of claim 8, wherein the second layer of low-refractive index material has an optical film thickness of $(0.2) \lambda_0$ to $(0.3) \lambda_0$.

14. The optical element of claim 8, wherein the optical substrate is glass.

15. The optical element of claim 8, wherein each of the low-refractive index layers is selected from a group consisting of magnesium fluoride, aluminum fluoride, sodium fluoride, lithium fluoride, calcium fluoride, barium fluoride, strontium fluoride, cryolite, chiolite, and combinations thereof.

16. The optical element of claim 8, wherein the high-refractive index layer is selected from a group consisting of neodymium fluoride, lanthanum fluoride, gadolinium fluoride, dysprosium fluoride, aluminum oxide, lead fluoride, yttrium fluoride, and combinations thereof.

* * * * *